(12) United States Patent
Pandey et al.

(10) Patent No.: US 7,962,886 B1
(45) Date of Patent: Jun. 14, 2011

(54) METHOD AND SYSTEM FOR GENERATING DESIGN CONSTRAINTS

(75) Inventors: Manish Pandey, San Jose, CA (US);
Marcelo Glusman, San Jose, CA (US);
Angela Krstic, San Diego, CA (US);
Yee-Wing Hsieh, Pleasanton, CA (US);
Andy Lin, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 683 days.

(21) Appl. No.: 11/952,798

(22) Filed: Dec. 7, 2007

Related U.S. Application Data (60) Provisional application No. 60/873,886, filed on Dec. 8, 2006.

(51) Int. Cl.
*G06F 17/50* (2006.01)
(52) U.S. Cl. .................................................. 716/136
(58) Field of Classification Search .................. 716/1–18
See application file for complete search history.

(56) References Cited

U.S. PATENT DOCUMENTS

| | | | |
|---|---|---|---|
| 6,691,301 B2 * | 2/2004 | Bowen | 717/114 |
| 6,877,139 B2 | 4/2005 | Daga | |
| 7,124,386 B2 | 10/2006 | Smith et al. | |
| 7,152,215 B2 | 12/2006 | Smith et al. | |
| 7,174,520 B2 | 2/2007 | White et al. | |
| 7,243,316 B2 | 7/2007 | White et al. | |
| 7,325,206 B2 | 1/2008 | White et al. | |
| 7,353,475 B2 | 4/2008 | White et al. | |
| 7,356,783 B2 | 4/2008 | Smith et al. | |
| 7,360,179 B2 | 4/2008 | Smith et al. | |
| 7,363,099 B2 | 4/2008 | Smith et al. | |
| 7,363,598 B2 | 4/2008 | Smith et al. | |
| 7,367,008 B2 | 4/2008 | White et al. | |
| 7,380,220 B2 | 5/2008 | Smith et al. | |
| 7,383,521 B2 | 6/2008 | Smith et al. | |
| 7,393,755 B2 | 7/2008 | Smith et al. | |
| 2003/0093765 A1* | 5/2003 | Lam et al. | 716/18 |
| 2005/0037522 A1 | 2/2005 | Smith et al. | |
| 2005/0051809 A1 | 3/2005 | Smith et al. | |
| 2005/0132306 A1 | 6/2005 | Smith et al. | |
| 2005/0196964 A1 | 9/2005 | Smith et al. | |
| 2005/0235246 A1 | 10/2005 | Smith et al. | |
| 2005/0251780 A1* | 11/2005 | Nakashiba | 716/18 |
| 2006/0123370 A1* | 6/2006 | Vergara-Escobar | 716/6 |
| 2007/0101305 A1 | 5/2007 | Smith et al. | |
| 2007/0256039 A1 | 11/2007 | White | |
| 2008/0027698 A1 | 1/2008 | White | |
| 2008/0114813 A1* | 5/2008 | Leonard et al. | 707/200 |
| 2008/0160646 A1 | 7/2008 | White et al. | |
| 2008/0162103 A1 | 7/2008 | White et al. | |
| 2008/0163139 A1 | 7/2008 | Scheffer et al. | |
| 2008/0163141 A1 | 7/2008 | Scheffer et al. | |
| 2008/0163142 A1 | 7/2008 | White et al. | |
| 2008/0163148 A1 | 7/2008 | Scheffer et al. | |
| 2008/0163150 A1 | 7/2008 | White et al. | |
| 2008/0216027 A1 | 9/2008 | White et al. | |
| 2009/0031261 A1 | 1/2009 | Smith et al. | |
| 2009/0031271 A1 | 1/2009 | White et al. | |

* cited by examiner

*Primary Examiner* — Vuthe Siek
*Assistant Examiner* — Aric Lin
(74) *Attorney, Agent, or Firm* — Vista IP Law Group, LLP (57) ABSTRACT

A method and system for generating design constraints for an electronic circuit design is disclosed. The method and system include reading a design description and an existing design constraint file, configuring design constraint integration rules, writing a new design constraint file, evaluating results of the new design constraint file, and replacing existing design constraint file with the new design constraint file.

26 Claims, 9 Drawing Sheets

METHOD AND SYSTEM FOR GENERATING DESIGN CONSTRAINTS

CROSS-REFERENCE TO RELATED APPLICATIONS

This application claims the benefit of U.S. Provisional Application No. 60/873,886 filed on Dec. 8, 2006, which is hereby incorporated by reference in its entirety.

BACKGROUND

1. Field

The field of the present invention relates to electronic circuit design and, in particular, to generating design constraints for electronic circuit designs.

2. Description of Related Art

Typically, a design flow at various levels of design abstraction involves specifying design constraints while different synthesis tools optimize the design around these constraints. In case of timing constraints, after synthesis, a static timing analysis is used to verify whether a design is meeting the timing budget. If this is not the case, the static timing analysis produces a critical path report. Typically, static timing analysis ignores the logic function of the gates in the design. Therefore, certain critical paths may turn out to be not sensitizable. The designer may analyze all the critical paths to determine whether a critical path is a false path or a multi-cycle path. Since false paths may not be sensitized, they should not be considered in static timing analysis. For multi-cycle paths, the timing budget may be extended to multiple clock cycles. Therefore, if such paths are found, the design constraints are modified accordingly. Otherwise, the design is modified to meet the design specification. This process continues until there are no remaining timing violations in the design.

There are many challenges in this design process. First, the design constraints are developed manually and therefore are susceptible to errors. Second, as the complexity of the designs increases, the design may be partitioned into multiple blocks. As a result, the design constraints also need to be partitioned accordingly. Maintaining correctness and consistency in the design constraints between block boundaries and between block constraints and the top-level, full-chip constraints become a challenge. For that matter, integrating block level design constraints for various IP cores developed at the block level by block owners, into top-level, full-chip design constraints for global timing analysis and synthesis, also becomes a challenge. This is a task that is usually done manually or with the aid of ad-hoc scripts. It may also be useful after the physical partitioning phase. Moreover, there might be bugs in the design which cause inconsistencies between functional behavior of a design and a design constraint specification given in a format, such as Cadence Common Timing Engine (CTE) Design Constraint Format, Synopsys Design Constraint (SDC) Format, and/or various other design constraint specifications).

SUMMARY

Some embodiments of the invention relate to electronic circuit design and to generating design constraints for electronic circuit designs. Design constraints may include timing constraints, such as clock characterization, delay specifications, and timing exceptions, such as false path and multi-cycle path exceptions.

In one embodiment, a method for generating design constraints includes reading a design description and an existing design constraint file, configuring design constraint integration rules, writing a new design constraint file, evaluating results of the new design constraint file, and replacing existing design constraint file with the new design constraint file.

In one embodiment, timing constraint methodology presented herein addresses the above-mentioned challenges of the prior art by automating the tedious and error prone manual process of constraint creation and by eliminating constraint correctness and consistency issues. As will be described herein, an improved set of constraints will allow synthesis to produce better results in less runtime.

Previous work in timing exception generation has been based solely on RTL designs and may involve designers to specify clocks in the design. Furthermore, it generated timing exceptions for the entire design without considering the exception's impact on the quality of the results downstream.

In one embodiment, an approach is a flexible and integrated approach that supports RTL designs and gate-level designs. Timing exceptions are extracted directly from the design with techniques that ensure positive impact on the quality of the results downstream in the design process. A validation engine may be included and may be independent of the validation methodologies. For example, multiple validation methodologies may be supported, such as combinational and sequential timing exception, static and dynamic timing analysis, and timing exception candidate filtering.

Design constraints, including timing constraints such as clock characterization, delay specifications, and timing exceptions such as false path and multi-cycle path exceptions, constitute an important part of the overall design process. These constraints are used in every design phase, including RTL synthesis and physical placement and routing. Unfortunately, in some instances, the constraints are developed manually. With increasing design size and complexity, these design constraints also increase in number and complexity. Incorrect and/or incomplete constraints may lead to sub-optimal designs, in terms of area, timing and/or power, or even worse, may lead to silicon failures.

In one embodiment, a comprehensive integrated methodology for automatic creation of timing exceptions is disclosed. Structural analysis and formal validation techniques may be employed to provide an automated solution to the constraint creation problem. The two key components of constraint creation methodology may include design constraint integration techniques used for creation of top-level constraints though automated promotion and integration of sub-block constraints and timing exception generation techniques that use automated design exploration for selecting a small set of potential candidates for false path and multi-cycle-path exceptions which are then validated using formal validation engines.

In one embodiment, methodology discussed herein may support the generation of constraints for both RTL and gate-level designs and may generate combinational as well as sequential timing constraints. In one aspect, while techniques may create constraints by analyzing the design with minimal mode constraints and the timing exceptions may be generated for the entire design, they are also flexible to allow for additional user information to generate a small number of exceptions with the highest positive impact on the design flow (e.g., generating exceptions for specific regions of the design or by only considering long timing paths, etc).

In one embodiment, generated timing exceptions may be written out in a compressed or uncompressed design constraint format.

These and other objects and advantages of the present teachings will become more fully apparent from the following description taken in conjunction with the accompanying drawings.

DETAILED DESCRIPTION

Various embodiments of the present invention are described hereinafter with reference to the drawings. It should be noted that the drawings are not drawn to scale and that elements of similar structures or functions are represented by like reference numerals throughout the drawings.

In one embodiment, timing constraint creation methodology provides a comprehensive automated constraint creation flow that generates timing constraints that are proven correct and consistent. One contribution of this methodology includes a new design constraint integration technique that provides methodical means for integrating sub-block constraints so as to maintain correctness and consistency of top-level constraints. Another contribution of this methodology includes techniques for automatic design exploration and use of formal verification methods to generate and prove timing constraints by systematic means.

In greater detail herein, topics that will be discussed include design constraint integration aspects of constraint creation, automated constraint creation, timing exception generation and design constraint integration.

Integration of block level constraints into a full-chip constraint set is a delicate task, because the constraints taken from a block, and in particular the timing exceptions, may take on an unexpected meaning at the top-level. It is of particular importance to avoid manipulating constraints purely at the textual level. In one aspect of the invention, the meaning of the constraints is propagated to top-level entities, and then written out as new commands that may or may not resemble the original ones.

In one embodiment, design constraint integration allows the user to specify an initial, partial chip-level design constraint file whose contents are considered "golden". This set of constraints is enhanced by promoting individual timing constraints (including clock and delay attributes, constants and timing exceptions) from the block design constraint files, and the result is written out as a new design constraint file.

It is important not to promote all the constraints at once. For example, it is impossible to properly analyze constant propagation and the reach of clock trees before the correct constants are set on the design. Therefore, design constraint integration allows the integration of constraints in phases. As will be described in greater detail herein, a first phase is the promotion of set_case_analysis commands, a second phase covers the clocks, and so on. After each phase, the resulting constraints are regarded as the new partial top-level design constraint file. When promoting design constraints, it is necessary to perform structural checks and apply customer-driven policies and methodologies. Methodology discussed herein is flexible by providing a reasonable level of configurability while keeping the interface easy to use.

In one embodiment, design constraint integration methodology is rule based, wherein each integration rule is dedicated to a particular type of design constraint. A rule may be instantiated any number of times. The user may define instances from scratch, or a default configuration file provided by the tool may be used. A rule instance includes a condition and one or more actions and action options. A condition includes one or more predicates that are used to establish whether a rule instance matches a given constraint that is being considered to be promoted. The actions may stipulate whether the constraint should be promoted or not, and how it should be promoted. They may also provide the user with pertinent messages.

In one embodiment, rule instances have numerical priorities that may be used to decide conflicts between multiple rule instances that match the same constraint but stipulate contradicting outcomes.

Each time new constraints are created, some embodiments of methods and systems of the invention perform hierarchical consistency checks, which allow the user to identify any problems before proceeding to a next phase. The user is involved in the process, but manual work is shifted from tedious manipulation of design constraint commands to the (more productive) analysis of results and refinement of the integration configuration. In a resulting design constraint file, newly written commands are accompanied by a clear annotation of the source commands of the attributes they convey. In addition, there is an annotation of the name of the rule instance that caused each constraint to be promoted.

To generate timing exceptions, some embodiments of methodology of the invention select a set of candidates by structural analysis of the design. In one aspect, the methodology may generate constraints for the entire design or it may take into account any user specified input about the specific regions of the design or about the delays of the paths to be considered. For example, some embodiments may utilize critical path information to partition the design for timing exception generation.

Some embodiments of methodology of the invention make use of formal verification engines to verify the behavior of the selected candidates for timing exceptions. In one aspect, each of the specified false path or multi-cycle path candidates are analyzed and path sensitization conditions and holding conditions are extracted. For false paths, the methodology proves that these paths may not be sensitized by any input pattern. For multi-cycle paths, the methodology verifies that the source of multi-cycle paths holds for previous n−1 cycles when the multi-cycle paths are sensitized. The generated timing exceptions may be written out in a compressed or uncompressed form. In one aspect, the output of the methodology is a set of timing constraints that may be used by synthesis and timing analysis tools to verify that the design meets the timing specifications.

In addition to using the methodology to support generation of timing exceptions, the formal validation technique may also be used to verify any user specified timing exceptions (false paths or multi-cycle paths) or for validating critical paths from timing reports generated by timing analysis tools. If any of the critical paths are verified to be false paths, then the corresponding design constraint false path timing exceptions are generated and integrated into the original design constraint specification. The modified design constraints may then help achieve a more optimized design through resynthesis.

In one aspect, generating a large number of constraints does not necessarily benefit the synthesis tools since it slows them down and may make their job harder. Therefore, after generating the timing constraints, the methodology performs compression to group similar constraints into single design constraint statement and reduces or minimizes the size of the generated design constraint.

To ensure the generated constraints have positive impact downstream, the methodology analyzes the critical paths in the design to determine whether any of the paths with timing violations are false paths. If any of these paths are false paths, the methodology generates false path exceptions by performing structural analysis and eliminates redundant through points. In one aspect, removing redundant through points may give synthesis tools and implementation tools more freedom in optimization and provide better quality of results. This type of false path generation may be referred to as critical path generation.

Another aspect of using critical path for false path generation is to partition the design into regions with timing violations and to perform analysis only for these regions. This type of false path generation may be referred to as directed false path generation. An alternative to critical path report is to prune the design by estimating path length and partition the design such that analysis is only performed on long paths. By partitioning the design with timing violations, performance may be improved both in terms of memory and CPU time, but more importantly, the methodology generates constraints that will most likely have positive impact downstream from synthesis down to physical implementation such as place and route.

Besides functional timing constraints, the methodology may also automatically extract clock domain crossing false paths and asynchronous set/reset false paths. For clock domain crossing false paths, automatic partitioning of clock domains by extracting clock domain crossing synchronizers is provided in the design. For synchronous set/reset false paths, analysis is performed to identify common asynchronous set/reset signals to minimize the number of constraints generated. Clock domain crossing false paths and asynchronous set/reset false paths are usually specified in RTL synthesis, where they are handled separately during implementation stage.

Figure 1:
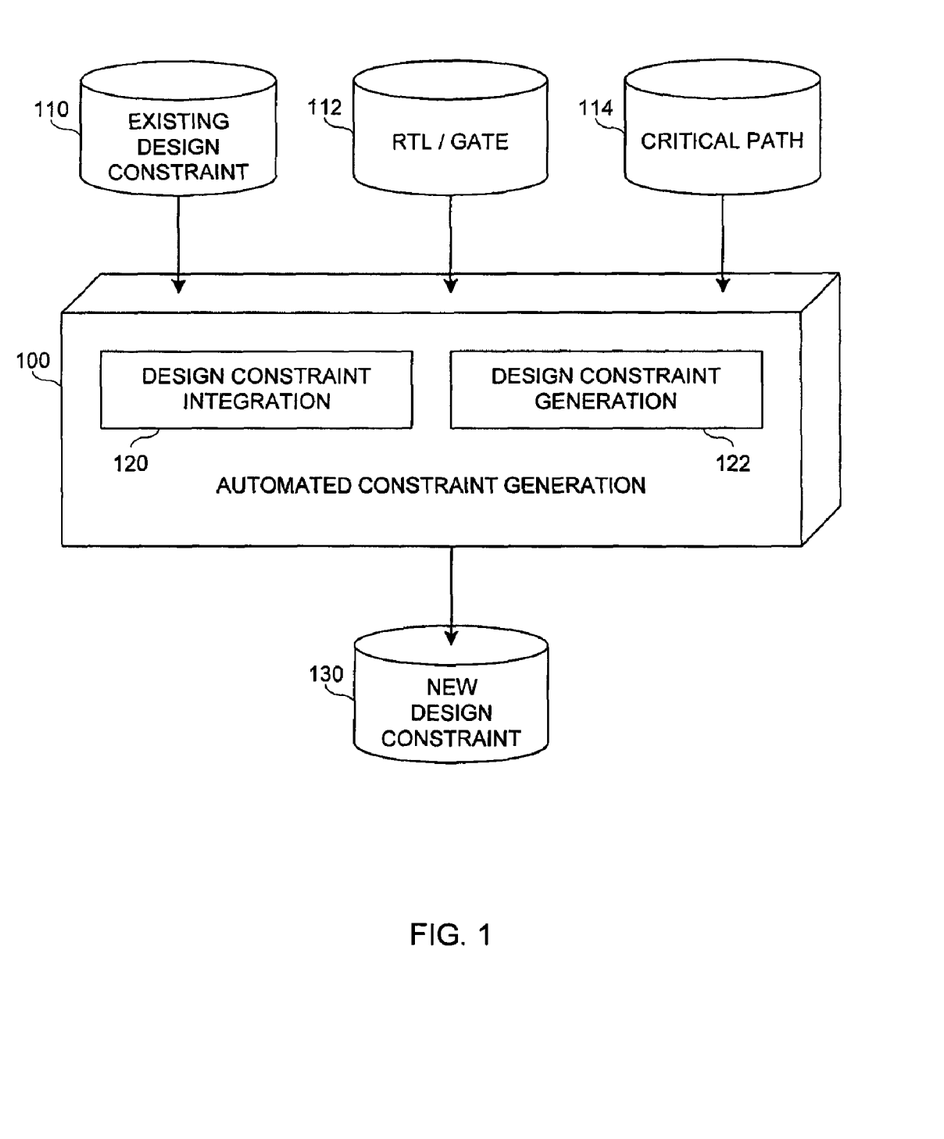
FIG. 1 shows one embodiment of a high-level constraint creation flow.

FIG. 1 shows one embodiment of a high-level process flow 100 of an automatic constraint generation process. As shown, inputs 110, 112, 114 to process 100 are received from an RTL or a gate-level design, existing design constraint specifications (if any), and/or timing reports (if they exist). Given the RTL or gate level design, the design constraint process 100 collects information about path statistics, such as a number of paths in the design, a path distribution by delays, a number of logic levels, etc., and outputs an design constraint file 130. Further scope and function related to automatic constraint generation process 100 including design constraint integration 120, design constraint exception generation 122 and generated design constraint files will be described in greater detail herein.

One aspect of methodology of the invention is to automatically extract clock candidates from the design by tracing the clock tree and applying reconvergence analysis to identify common points for clock and generated clocks. This feature may be referred to as a clock advisor. Any mode signals automatically extracted from the design or specified by the user are used to prune the clock candidates.

Another aspect of methodology of the invention is to automatically extract mode signals in the design by analyzing multiplexer (MUX) structures in the design and taking into account clock signals automatically extracted or specified by the user. This feature may be referred to as a mode advisor. Since clock and mode signals extraction are interdependent, any changes in clock and mode signal extraction automatically update the candidates in one or the other.

Yet another aspect of methodology of the invention is to partition the design for exception generation by estimating critical regions in the design in the absence of critical path reports. The partition is achieved by identifying long paths in the design with path length analysis. This feature may be referred to as path statistics.

Abstractions reduce the complexity of the problem by reducing the model size. In order to be useful, an abstraction should only add extra circuit behavior. That way, in one aspect, if a path is found to be sensitizable on the abstract model, the method may guarantee that it is sensitizable on the original design as well. On the other hand, if a path is found to be unsensitizable (i.e., no pattern exists that may sensitize it) in the abstract model, its sensitization needs to be further validated on the original design.

In one embodiment, to simplify the exception generation/validation process, automatic logic abstractions may be performed. Moreover, an embodiment of a technique of the invention may take specifications of manual abstractions into account as well. It should be appreciated that logic abstraction enables the methodology to support efficient exception generation for RTL design as well as gate-level designs.

In one aspect, the outcome of the exception generation and design constraint integration process are new or revised design constraint specifications that may be used to further optimize the design.

Figure 2A:
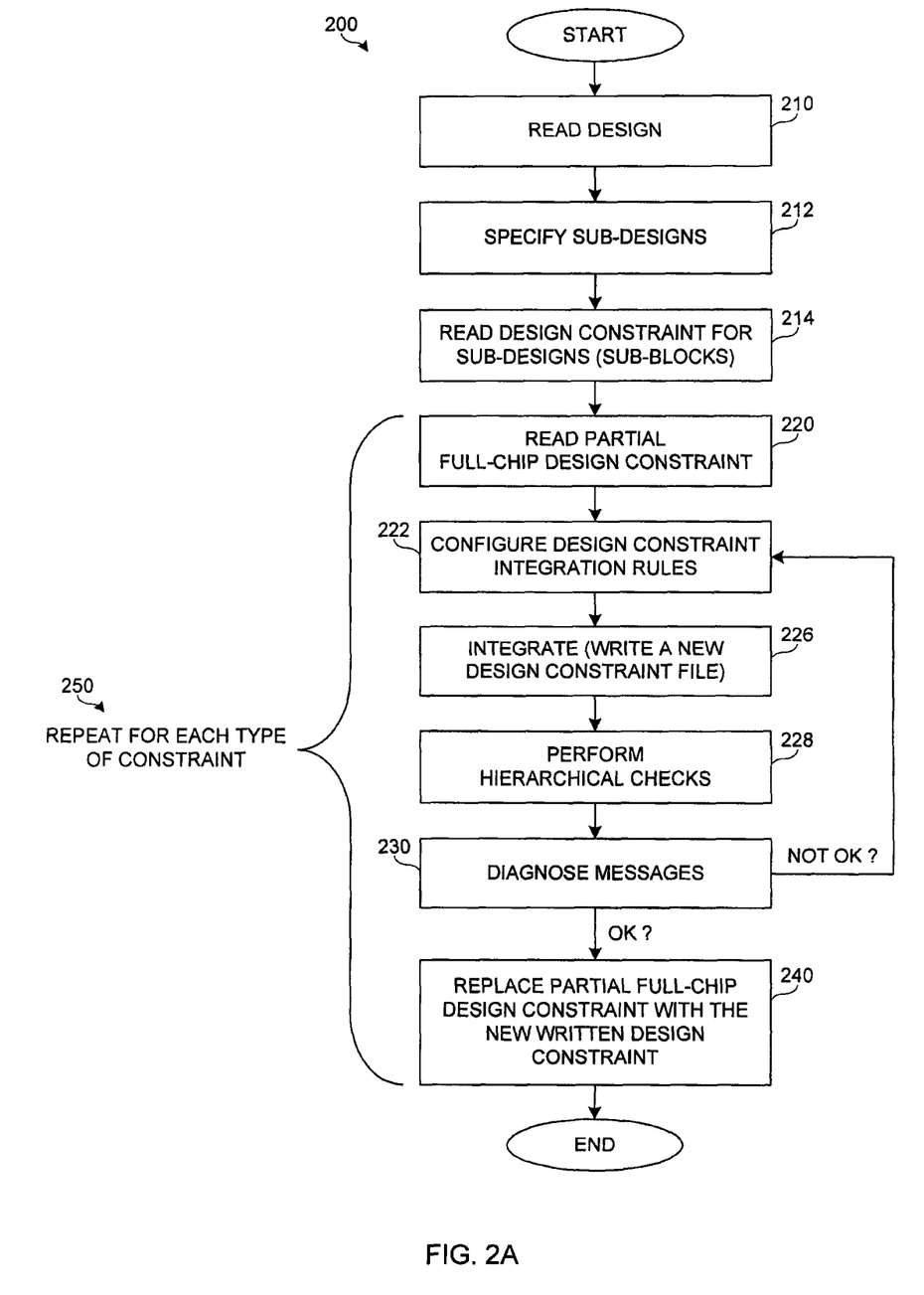
FIG. 2A shows one embodiment of a design constraint integration method.

FIG. 2A is a block diagram describing one embodiment of a method 200 for design constraint integration and design constraint integration usage flow.

In 210, the process 200 begins by reading a library and design for an electronic circuit.

In 212, sub-designs within the electronic circuit design are specified.

In 214, a design constraint format for the sub-designs (sub-blocks) is read from the electronic circuit design. In one embodiment, this may include defining all sub-designs or sub-blocks and reading all the design constraint files for the top-level module and the blocks, as well as any existing partial full-chip design constraint files.

In 220, a partial full-chip design constraint file for the electronic circuit design is read.

In 222, design constraint integration rules for the electronic circuit design are configured. In one embodiment, configuration of design constraint integration rules may be accomplished at any stage before integration in 226. This may involve the creation of rule instances that target each particular attribute to be ignored, reported, and/or promoted. 222 may be achieved by loading a default configuration file, or this may be completely user-specific, or this may be a combination of both.

In 226, the design constraint integration rules are used to integrate design constraints from the sub-designs of the electronic circuit design by writing a new design constraint file for the electronic circuit design. In one embodiment, 226 may include activating an integration mechanism for one or more types of constraints, such as clocks, external delays, timing exceptions, etc.

In 228, hierarchical checks of the new design constraint file for the electronic circuit design are performed to verify consistency of the generated design constraints with the provided constraints of the sub-designs specified within the electronic circuit design.

In 230, messages, such as error messages and various other types of verification messages, are evaluated and diagnosed by the user. If the diagnosis or evaluation encounters problems or conflicts, such as errors or various other types of integration issues, then 222 through 230 are repeated to correct encountered problems or conflicts. Otherwise, if the diagnosis or evaluation does not encounter problems or conflicts, then 200 proceeds to 240.

In 240, the partial full-chip design constraint is replaced with the newly written design constraint, and 200 terminates.

In one embodiment, 220 thru 240 of 200 may be repeated 250 for each type of constraint, such as clock timing, input/output delays, timing exceptions, etc. These may be repeated for the same type of constraints when the results of the diagnosis or evaluation of 230 are not satisfactory and/or acceptable to a user. Following 240, 220 thru 240 may be applied to each type of constraint.

This method 200 for design constraint integration usage flow creates, applies and checks new top-level design constraints and writes a new design constraint file. Integration rule instances and hierarchical checks report messages to a user. Analysis, evaluation and diagnosis of these messages may lead the user to modify the configuration of the integration rules for improved performance, integrity and reliability of the electronic circuit design.

Figure 2B:
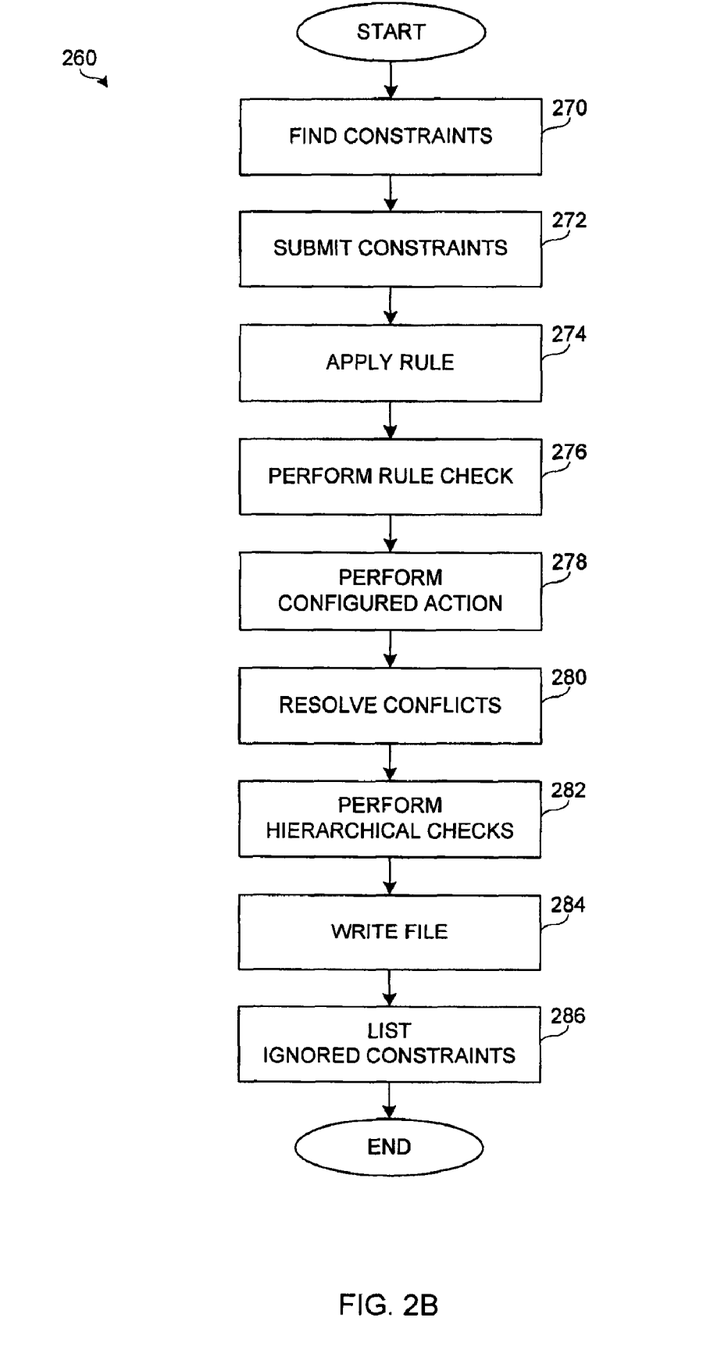
FIG. 2B shows one embodiment of an integration method.

FIG. 2B is a block diagram of one embodiment of a method 260 for integrating rules in a new design constraint file. In one aspect, the following is a description of 226 of method 200 taken during each activation of the integration mechanism after configuration and all the input data has been provided.

260 begins in 270, wherein for each type of constraint specified by the user, such as clocks, external delays, timing exceptions, etc., 270 finds the constraints of that type in all the sub-designs or sub-blocks to be integrated.

In 272, each constraint is submitted to an integration rule relevant to the current constraint type.

In 274, the integration rule applies all existing rule instances to all existing constraints.

In 276, each instance, when applied to a constraint, checks whether the configured condition is satisfied and, in 278, performs the configured action or actions, such as a request to promote, a request not to promote and/or a request to produce a message.

In 280, conflicts between requests to promote and requests not to promote are resolved based on rule instance priority. In one aspect, constraints are promoted as requested by matching instances.

In 282, hierarchical checks may be applied before continuing to the next type of constraint. In one aspect, some hierarchical checks available may include (a) inconsistent set_case_analysis in a block vs. top-level, (b) exactly one top-level clock tree propagates to a block's clock port, (c) input/output delays set on block ports correspond to the clock domains of paths that traverse those ports, and/or (d) paths within each block are affected by the same timing exceptions as their corresponding top-level paths.

In 284, a file containing all full-chip constraints is written, and in 286, ignored constraints are listed separately (or as a comment within the same file). After 286, 260 terminates.

Timing exceptions are false paths or multi-cycle paths. False paths are defined as paths that may not affect the design timing. This is because they may not be sensitized by any input pattern. Therefore, false paths do not need to be considered when checking if the design is meeting the timing specifications (i.e., during static timing analysis). Also, in case the design is not meeting the specifications, the knowledge about false paths may be used in the resynthesis process to help optimize the design.

Figure 3:
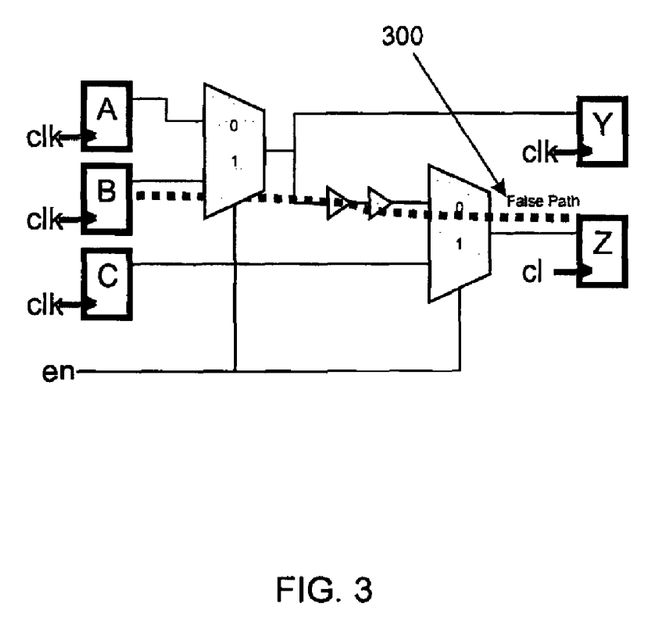
FIG. 3 shows one embodiment of a false path due to reconvergent signals.
Figure 4:
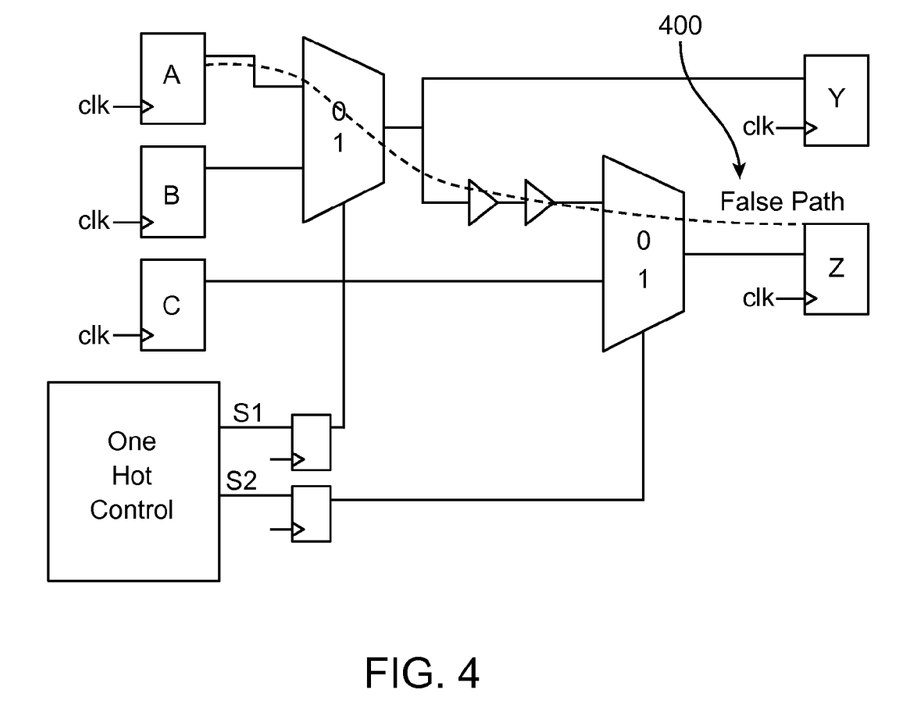
FIG. 4 shows one embodiment of a functional false path.

One reason for a design to have false paths are signal correlations and dependencies introduced by reconvergent fan-outs. False paths may also exist due to unreachable states or design redundancies (e.g., redundant stuck-at faults). FIG. 3 shows a false path 300 between registers B and Z. In one aspect, this false path is a result of logical signal dependencies between the control inputs of the two MUXs in FIG. 3 (both control inputs originate from the same signal en). FIG. 4 shows a false path 400 due to unreachable states. In this circuit, since the controller generates one-hot signals S1 and S2, the path from register A to register Z is not a sensitizable path.

Figure 5:
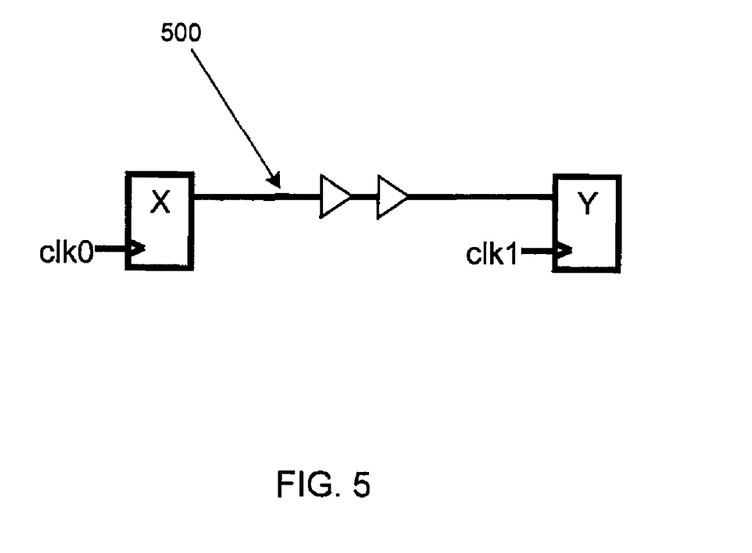
FIG. 5 shows one embodiment of a clock domain crossing false path.

In addition to these functional false paths, clock domain crossing paths are also considered to be false paths. For example, FIG. 5 shows a clock-domain crossing false path 500 between registers X and Y. In this case, clocks clk1 and clk2 are asynchronous clocks. For signals in different clock domains, it is difficult to identify the order in which they will be arriving and special clock domain crossing synchronization is necessary to make sure the signals are stable before they may be accessed. In one aspect, to generate clock domain crossing false paths, clock domains are propagated with respect to created clocks, generated clocks, virtual clocks and clock domain associations. If the source and the destination of a candidate false path are from two different clock domains, then the false path check is considered as a pass. Paths to asynchronous set/reset inputs of sequential elements, as well as paths passing through signals tied to constant values do not need to be timed by timing analysis tools and therefore, are also considered as false paths. Generation of these non-functional false path constraints is simple, and in this work, the methodology may focus on generating functional false path constraints.

Figure 6:
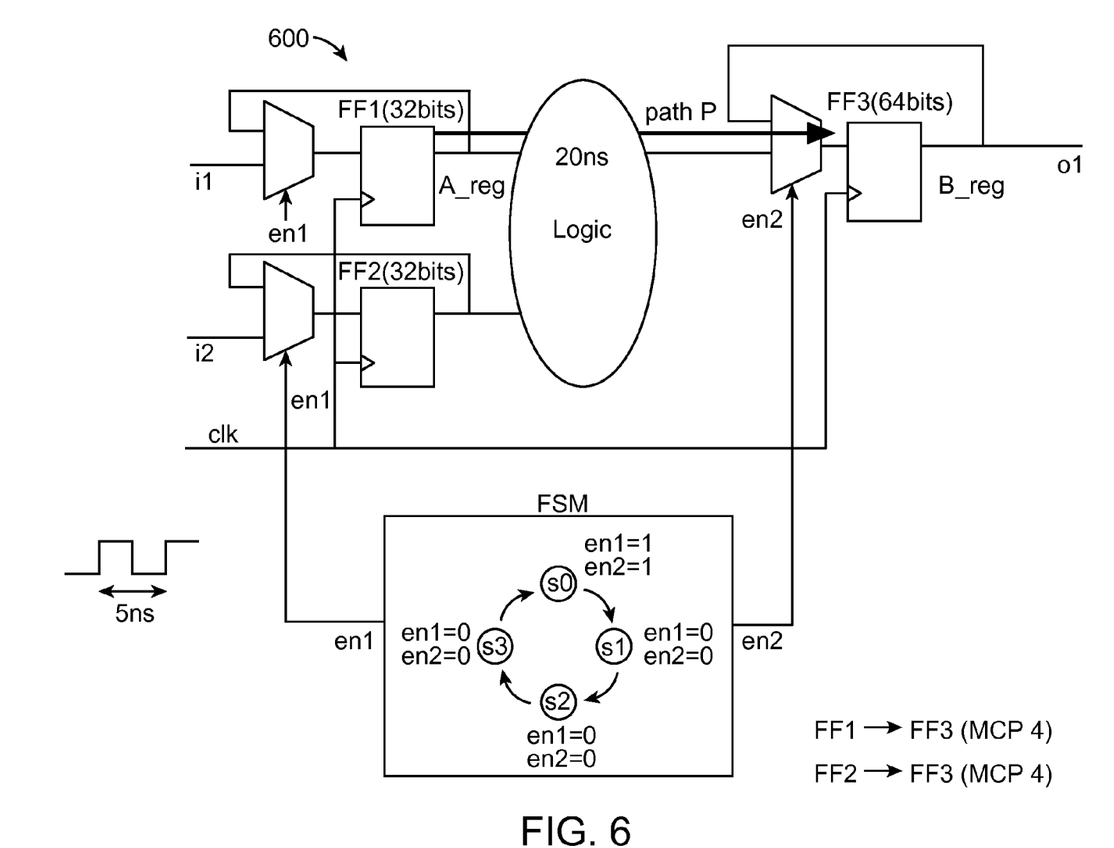
FIG. 6 shows one embodiment of a multi-cycle path.

In one aspect, multi-cycle paths are paths driven by inputs which need to hold their value for n cycles before the results may be read. FIG. 6 shows an example of a MUX-based multi-cycle path 600. Here holding logic may be in the form of feed back path from the output of flip-flop back to the input of the flip-flop. This may be referred to as data-path holding logic. Another form of holding logic is to disable the clock input of the flip-flop. This may be referred to as clock-path holding logic or as gated clocks. In our approach, the methodology supports multiple multi-cycle path modeling and multiple multi-cycle path properties.

Figure 7:
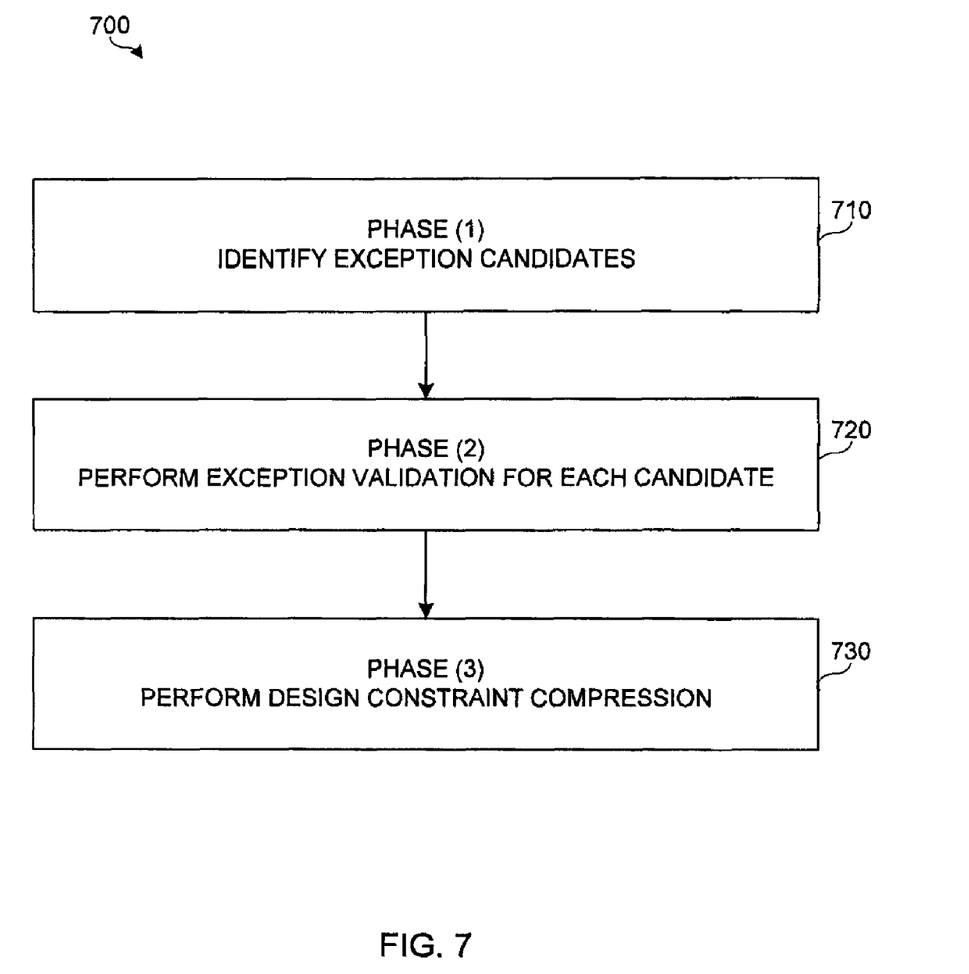
FIG. 7 shows one embodiment of a timing exception generation flow.

In one embodiment, timing exception generation process 700 of the invention comprises three main phases 710, 720, 730. As shown in FIG. 7, a first phase 710 comprises a phase of identifying and filtering potential candidates for false paths, a second phase 720 comprises a phase of validating candidates, and a third phase 730 comprises constraint compression. Each of these phases will be discussed in greater detail herein.

Phase (1) 710 of FIG. 7 comprises timing exception candidate identification and filtering. In one embodiment, identifying timing exception candidates includes the use of one or more critical path reports to identify candidates in critical regions. Alternately, in another embodiment, identifying timing exception candidates includes the use of path length information to filter exception candidates.

It should be appreciated that several methods may be used to identify false path candidates. One method considers all possible pairs of PIs, POs, and registers as potential candidates. Other methods to limit the number of candidates include analyzing paths through control signals extracted from RTL, analyzing paths through control signals from FSMs, analyzing paths with MUX structures, and/or identifying candidates through reconvergent region analysis.

In one aspect, false path generation flow analyzes the design with minimal mode constraints and generates constraints for the entire design. However, one objective of timing exception generation is generating a small number of exceptions that includes a positive impact downstream, such as better quality of result (QoR) in timing and/or faster synthesis and timing analysis runs. Therefore, several path pruning techniques are applied to generate possible candidates. These may include limiting the search region to a user specified region (from/to/through), using path statistics to guide the search, and/or limiting the search to paths with delays exceeding a given threshold (or a given number of logic levels in the absence of delay information).

In one embodiment, methodology of the invention may also make use of timing reports provided by timing analysis tools to generate false paths. Using the reports, false paths may be generated either by validating the specified critical paths and augmenting the existing set of design constraint exceptions or by using information about critical paths to define critical path design regions to direct our false path generation to search these regions. This filtering mechanism is especially useful given the fact that the most useful false path constraints in resynthesis and timing analysis are long (critical) false paths.

For multi-cycle paths, an exception candidate pruning technique is exactly the same as for pruning false path candidates. However, additional pruning of candidates may be achieved by filtering out false path in the design and identifying holding structures in the design either from data-path or clock path. Further pruning of candidates may be achieved by symbolic simulation and FSM extraction. Finally, the remaining candidates are validated using formal methods.

Phase (2) 720 of FIG. 7 comprises timing exception candidate validation. In one embodiment, formal methods are used to validate timing exceptions. However, this timing exception generation approach is independent of validation approaches. In one aspect, a fast validation engine supports multiple validation methodologies including combinational and sequential false path, static and dynamic analysis. However, multiple embodiments of validation engines may exist.

Several methods may be used to identify false path candidates. One method considers all possible pairs of PIs, POs, and registers as potential candidates. Other methods to limit the number of candidates include analyzing paths through control signals extracted from RTL, analyzing paths through control signals from FSMs, analyzing paths with MUX structures, and/or identifying candidates through reconvergent region analysis.

For multi-cycle path checks, the methodology analyzes and extracts a path enabling condition (PE) as well as a source hold enabling condition (HE) for the specified multi-cycle path. Next, formal proof engines verify that, if PE is 1, then HE is 1 for the previous n−1 clock cycles for all times. For example, in the circuit shown in FIG. 6, PE is 1 if (en2=1) and HE is 1 if (en1=0).

In one aspect, if PE is 0 for all times, then the multi-cycle path may not be sensitized. If a multi-cycle path can be sensitized and HE is 1 for previous n−1 clock cycle, whenever PE is 1, then multi-cycle path check passes. Otherwise, the multi-cycle path check fails. In this case, a counter-example is provided showing how path may be sensitized when the path's source had not held constant for n−1 cycles.

Phase (3) 730 of FIG. 7 comprises timing exception compression. In one aspect, to reduce the size of the generated design constraint after generation, some embodiments of the methodology perform exception compression. In compression, a set of constraints are grouped into a single design constraint statement. In one aspect, this compression is not based on the structural analysis of the design. Rather, it compares the generated exceptions by comparing their key points. Some embodiments of the methodology use a greedy algorithm that iteratively performs compression by picking the largest number of statements to compress.

Conventional methodology for timing exception generation is typically limited to RTL design. However, some embodiments of the methodology described herein support RTL and gate-level designs. Conventional methodology involves a user to specify clocks in the design. However, some embodiments of the methodology described herein extract clock and mode signals from the design itself.

Moreover, conventional methodology generates constraints for the entire design, which could overwhelm timing analysis, synthesis and physical implementation tools. Generating too many constraints often leads to inferior implementation with poor quality of results downstream.

In contrast, some embodiments of the methodology of the invention described herein utilize various methods including critical path information to prune the search space and efficiently generate timing exceptions with positive quality of result impact downstream from timing analysis and synthesis to physical implementation such as placement and routing.

Conventional methodology in design constraint integration is mostly manual work by designers, which is error prone.

In contrast, some embodiments of the methodology described herein incorporate flexible rule based methodology where the block level constraints are propagated to top-level constraints.

Figure 8:
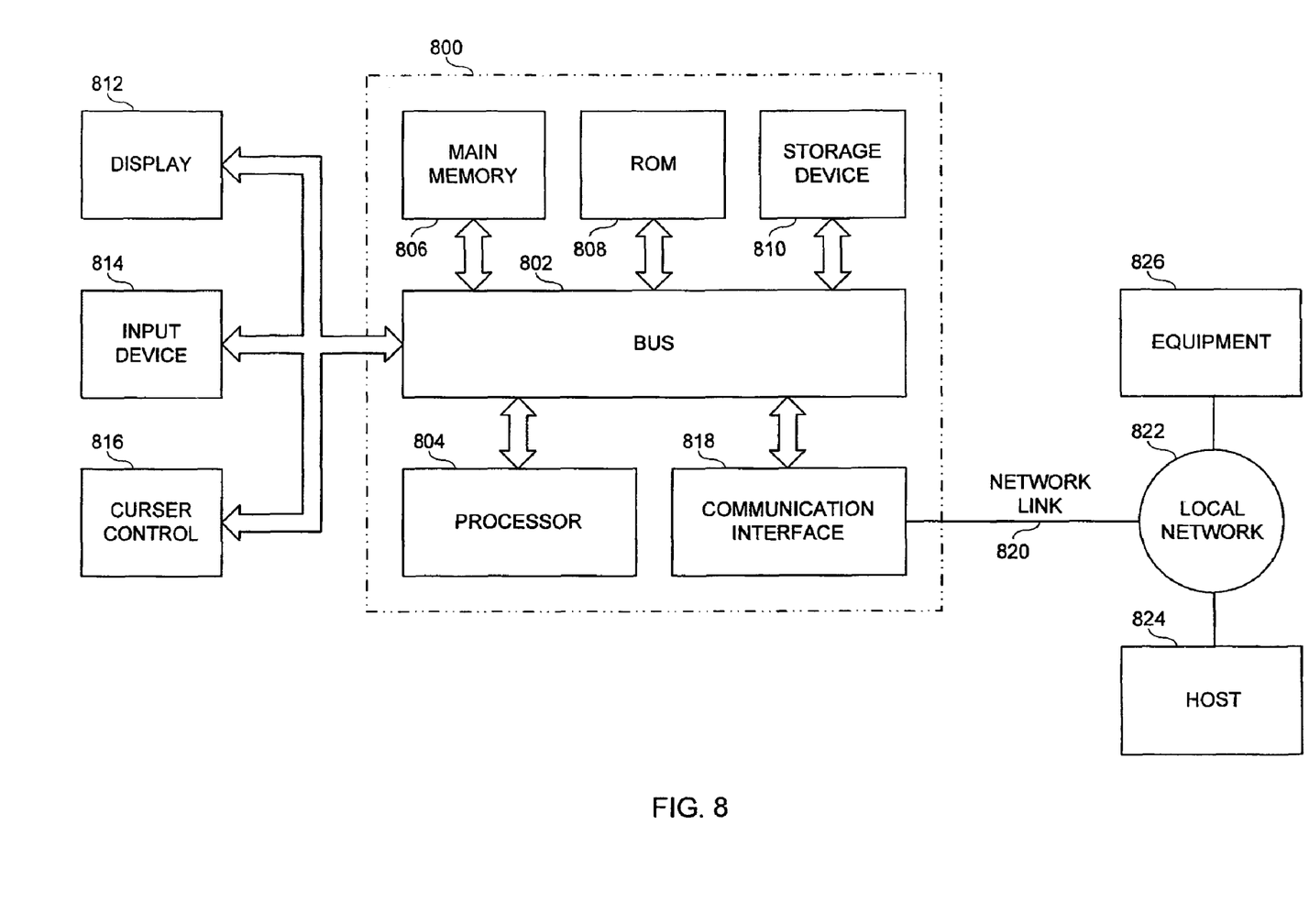
FIG. 8 shows one embodiment of a computer system with which embodiments of the invention may be implemented.

FIG. 8 shows an example of an embodiment of a block diagram of a computer system 800 that may be used to implement embodiments of the invention described herein. In particular, the computer system 800 stores and executes a computer software program for performing any of the functions or steps described herein. The computer system 800 includes a bus 802 or other communication mechanism for communicating information, and a processor 804 coupled with the bus 802 for processing information. The computer system 800 also includes a main memory 806, such as a random access memory (RAM) or other dynamic storage device, coupled to the bus 802 for storing information and instructions to be executed by the processor 804. The main memory 806 also may be used for storing temporary variables or other intermediate information during execution of instructions to be executed by the processor 804. The computer system 800 further includes a read only memory (ROM) 808 or other static storage device coupled to the bus 802 for storing static information and instructions for the processor 804. A data storage device 810, such as a magnetic disk or optical disk, is provided and coupled to the bus 802 for storing information and instructions.

The computer system 800 may be coupled via the bus 802 to a display 812, such as a cathode ray tube (CRT), for displaying information to a user. An input device 814, including alphanumeric and other keys, is coupled to the bus 802 for communicating information and command selections to processor 804. Another type of user input device is cursor control 816, such as a mouse, a trackball, or cursor direction keys for communicating direction information and command selections to processor 804 and for controlling cursor movement on display 812. This input device typically has two degrees of freedom in two axes, a first axis (e.g., x) and a second axis (e.g., y), that allows the device to specify positions in a plane.

Embodiments of the invention are related to the use of computer system 800 for generating design constraints. According to one embodiment of the invention, such use is provided by computer system 800 in response to processor 804 executing one or more sequences of one or more instructions contained in the main memory 806. Such instructions may be read into the main memory 806 from another computer-readable medium, such as storage device 810. Execution of the sequences of instructions contained in the main memory 806 causes the processor 804 to perform the process described herein. One or more processors in a multi-processing arrangement may also be employed to execute the sequences of instructions contained in the main memory 806. In alternative embodiments, hard-wired circuitry may be used in place of or in combination with software instructions to implement some embodiments of the invention. Thus, embodiments of the invention are not limited to any specific combination of hardware circuitry and software.

The term "computer-readable medium" as used herein refers to any medium that participates in providing instructions to the processor 804 for execution. Such a medium may take many forms, including but not limited to, non-volatile media, volatile media, and transmission media. Non-volatile media includes, for example, optical or magnetic disks, such as the storage device 810. Volatile media includes dynamic memory, such as the main memory 806. Transmission media includes coaxial cables, copper wire and fiber optics, including the wires that comprise the bus 802. Transmission media may also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer may read.

Various forms of computer-readable media may be involved in carrying one or more sequences of one or more instructions to the processor 804 for execution. For example, the instructions may initially be carried on a magnetic disk of a remote computer. The remote computer may load the instructions into its dynamic memory and send the instructions over a telephone line using a modem. A modem local to the computer system 800 may receive the data on the telephone line and use an infrared transmitter to convert the data to an infrared signal. An infrared detector coupled to the bus 802 may receive the data carried in the infrared signal and place the data on the bus 802. The bus 802 carries the data to the main memory 806, from which the processor 804 retrieves and executes the instructions. The instructions received by the main memory 806 may optionally be stored on the storage device 810 either before or after execution by the processor 804.

The computer system 800 also includes a communication interface 818 coupled to the bus 802. The communication interface 818 provides a two-way data communication coupling to a network link 820 that is connected to a local network 822. For example, the communication interface 818 may be an integrated services digital network (ISDN) card or a modem to provide a data communication connection to a corresponding type of telephone line. As another example, the communication interface 818 may be a local area network (LAN) card to provide a data communication connection to a compatible LAN. Wireless links may also be implemented. In any such implementation, the communication interface 818 sends and receives electrical, electromagnetic or optical signals that carry data streams representing various types of information.

The network link 820 typically provides data communication through one or more networks to other devices. For example, the network link 820 may provide a connection through local network 822 to a host computer 824 or to another equipment 826. The data streams transported over the network link 820 may comprise electrical, electromagnetic or optical signals. The signals through the various networks and the signals on the network link 820 and through the communication interface 818, which carry data to and from the computer system 800, are exemplary forms of carrier waves transporting the information. The computer system 800 may send messages and receive data, including program code, through the network(s), the network link 820, and the communication interface 818.

In various aspects, methodology of the invention provides many advantages. Clock signal candidates are automatically extracted by analyzing clock trees in the design and taking into account mode signals either specified by the user via set_case_analysis in the design constraint file or extracted through mode extraction. Mode signal candidates are automatically extracted by analyzing MUX in the design and taking into account clock signals in the design either specified by the user via create_clock in the design constraint or extracted through clock extraction. Critical path information is used to validate false paths and generate false paths timing constraints with positive quality of result impact downstream from synthesis to physical implementation, such as place and route. Critical path information is used to direct false path generation to perform analysis only on the regions with timing violations and thus generate false path constraints with positive impact downstream from synthesis to physical implementation such as place and route. Path length analysis is used to estimate critical region in the design (in the absence of critical path information from timing analysis tools or synthesis tools) to perform false path analysis. False paths are generated through automatic partitioning of clock domains by extracting of synchronizers in the design. Delay independent static/dynamic transition analysis is used to maintain consistent timing exceptions with different technology mapping and different level of abstractions. Rule-based integration of block level constraints to top level constraints is used. Rules are configured by use of rule instances that combine predefined conditions and actions. An incremental integration process is supported. Integration with hierarchical consistency rule checks is used. Embedded structural consistency analysis tools are available for use through rule configuration. Prioritization of rule instances is used to resolve conflicts. Integration with extensive rule reporting and diagnosis GUI tool to report inconsistencies during integration are used. Support for rule configuration based on Tcl variables is used. Annotation of the resulting promoted design constraint commands with both the source design constraint file and line number from the block design constraint, as well as with the name of the rule instance that generated that promoted constraint are used. The GUI-based design constraint source code browser turns these annotations into hyper-links that open the source design constraint file on the relevant line, and the rule configuration window on the pertinent rule instance.

In reference to design constraint integration, some embodiments of methodology of the invention may be described/implemented using different terms that are not necessarily identical to "rules", "rule configuration parameters" and "rule instances". These terms are just one possible choice of terminology. In one aspect, the user has a language that provides, on the one hand, a set of primitives that enable the analysis of all the design constraints and the interactions among them and between them and the design, and on the other hand, a means to combine those primitives and identify those combinations in a meaningful and manageable manner. This language is higher-level than a multi-purpose programming language. By combining a few building blocks specially designed for the integration task, the users may tailor an integration setup that will suit their own design methodology.

In one aspect, it should be appreciated that our methodology may be applied at more than one level of design hierarchy. If a design hierarchy is not flat, e.g., if a block is in turn partitioned into sub-blocks, then the integration methodology described here may be used to integrate constraints of sub-blocks into a single constraint set for the block. Later, all the block constraints may be integrated into a full-chip constraint set. In no way should this method be seen as restricted to top-level integration only. For clarity, we described the methodology as applied when integrating the top-level blocks, but lower-level integration is done in exactly the same way.

Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed is:

1. A method for generating design constraints comprising:
   reading a design description and an existing design constraint file;
   configuring design constraint integration rules;
   writing, by using a processor, a new design constraint file, wherein the act of writing comprises resolving conflicts between requests to promote and requests not to promote based at least in part upon a rule instance priority;
   evaluating results of the new design constraint file; and
   replacing existing design constraint file with the new design constraint file.

2. The method of claim 1, wherein reading a design description includes reading a hardware description language for the design.

3. The method of claim 1, further comprising specifying at least one sub-design in the design.

4. The method of claim 1, further comprising reading a design constraint format for at least one sub-design in the design.

5. The method of claim 4, wherein reading a design constraint format for at least one sub-design includes defining the at least one sub-design in the design and reading design constraint files for the at least one sub-design.

6. The method of claim 1, further comprising reading a partial full-chip design constraint file for the design.

7. The method of claim 1, wherein configuration of design constraint integration rules includes the creation of rule instances that target one or more constraint attributes of the design.

8. The method of claim 1, wherein the design constraint integration rules are used to integrate design constraints by writing the new design constraint file for the design.

9. The method of claim 8, further comprising activating an integration mechanism for one or more types of constraints including at least one of clocks, external delays, and timing exceptions.

10. The method of claim 1, further comprising performing hierarchical checks of the new design constraint file for the design to verify consistency of the new design constraint file.

11. The method of claim 1, wherein evaluating results of the new design constraint file includes evaluating messages including at least one of error messages and verification messages.

12. The method of claim 1, wherein if evaluating results of the new design constraint file encounters problems or conflicts, then at least a portion of the method is repeated to correct encountered problems or conflicts.

13. The method of claim 1, wherein one or more portions of the method are repeated for each type of constraint including at least one of clock timing, input/output delays, and timing exceptions.

14. The method of claim 1, wherein writing a new design constraint file includes integrating the design constraint integration rules in the new design constraint file.

15. The method of claim 14, wherein for each type of constraint specified by the user including at least one of clocks, external delays, and timing exceptions, one or more constraints of that type are found in the design.

16. The method of claim 15, wherein each constraint is submitted to at least one integration rule relevant to each type of constraint.

17. The method of claim 15, wherein each design constraint integration rule applies each existing rule instance to each existing constraint.

18. The method of claim 17, wherein a rule instance checks whether a configured condition is satisfied and then performs at least one configured action including at least one of a request to promote, a request not to promote, and a request to produce a message.

19. The method of claim 14, further comprising writing a design constraint file having one or more full-chip constraints and one or more ignored constraints are listed separately or as a comment within the design constraint file.

20. The method of claim 1, wherein one or more hierarchical checks are applied before continuing to the next type of constraint.

21. A system for generating design constraints comprising:
   a processor programmed for:
      reading a design description and an existing design constraint file;
      configuring design constraint integration rules;
      writing a new design constraint file, wherein the act of writing comprises resolving conflicts between requests to promote and requests not to promote based at least in part upon a rule instance priority;
      evaluating results of the new design constraint file; and
      replacing the existing design constraint file with the new design constraint file.

22. The system of claim 21, wherein the processor is further programmed for reading a design constraint format for at least one sub-design in the design, wherein the act of reading a design constraint format for at least one sub-design includes defining the at least one sub-design in the design and reading design constraint files for the at least one sub-design.

23. The system of claim 21, wherein writing a new design constraint file includes integrating the design constraint integration rules in the new design constraint file, and a rule instance checks whether a configured condition is satisfied and then performs at least one configured action including at least one of a request to promote, a request not to promote, and a request to produce a message.

24. A computer program product that includes a non-transitory computer-readable medium having a sequence of instructions which, when executed by a processor, causes the processor to execute a process for generating design constraints, the process comprising:
 reading a design description and an existing design constraint file;
 configuring design constraint integration rules;
 writing a new design constraint file, wherein the act of writing comprises resolving conflicts between requests to promote and requests not to promote based at least in part upon a rule instance priority;
 evaluating results of the new design constraint file; and
 replacing existing design constraint file with the new design constraint file.

25. The product of claim 24, further comprising reading a design constraint format for at least one sub-design in the design, wherein the act of reading a design constraint format for at least one sub-design includes defining the at least one sub-design in the design and reading design constraint files for the at least one sub-design.

26. The product of claim 24, wherein writing a new design constraint file includes integrating the design constraint integration rules in the new design constraint file, and a rule instance checks whether a configured condition is satisfied and then performs at least one configured action including at least one of a request to promote, a request not to promote, and a request to produce a message.

* * * * *